United States Patent
Hsiao et al.

(10) Patent No.: US 10,290,718 B2
(45) Date of Patent: May 14, 2019

(54) METAL-OXIDE-SEMICONDUCTOR TRANSISTOR AND METHOD OF FORMING GATE LAYOUT

(71) Applicant: UNITED MICROELECTRONICS CORP., Hsin-Chu (TW)

(72) Inventors: Shih-Yin Hsiao, Chiayi County (TW); Ching-Chung Yang, Hsinchu (TW); Wen-Fang Lee, Hsinchu (TW); Nien-Chung Li, Hsinchu (TW); Chih-Chung Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/667,633

(22) Filed: Aug. 3, 2017

(65) Prior Publication Data
US 2017/0330947 A1   Nov. 16, 2017

Related U.S. Application Data

(62) Division of application No. 14/952,877, filed on Nov. 25, 2015, now Pat. No. 9,761,657.

(30) Foreign Application Priority Data

Oct. 14, 2015   (TW) .............................. 104133652 A (51) Int. Cl.
*H01L 29/423* (2006.01)
*G06F 17/50* (2006.01)
(Continued)

(52) U.S. Cl.
CPC ...... *H01L 29/4238* (2013.01); *G06F 17/5072* (2013.01); *H01L 23/535* (2013.01); *H01L 29/0638* (2013.01); *H01L 29/0649* (2013.01); *H01L 29/0653* (2013.01); *H01L 29/0847* (2013.01); *H01L 29/4983* (2013.01);
(Continued)

(58) Field of Classification Search
CPC ............. H01L 29/4238; H01L 29/7833; H01L 29/0653; H01L 29/7816; H01L 29/0638; H01L 29/0649; H01L 29/7835; H01L 29/7836; H01L 23/535; H01L 29/66795; H01L 29/785; G06F 17/5072
See application file for complete search history.

(56) References Cited

U.S. PATENT DOCUMENTS 6,854,100 B1   2/2005   Chuang
8,125,051 B2   2/2012   Chuang
(Continued)

OTHER PUBLICATIONS

Chenming Calvin Hu, Modern Semiconductor Devices for Integrated Circuits, Chapter 5, MOS Capacitor, Feb. 13, 2009. p. 157-194.

*Primary Examiner* — Yasser A Abdelaziez
(74) *Attorney, Agent, or Firm* — Winston Hsu (57) ABSTRACT

A metal-oxide semiconductor transistor includes a substrate, a gate insulating layer disposed on a surface of the substrate, and a metal gate disposed on the gate insulating layer, wherein at least one of the length or the width of the metal gate is greater than or equal to approximately 320 nanometers, and the metal gate has at least one plug hole. The metal-oxide semiconductor transistor further includes at least one insulating plug disposed in the plug hole and two diffusion regions disposed respectively at two sides of the metal gate in the substrate.

6 Claims, 12 Drawing Sheets

(51) Int. Cl.

| | |
|---|---|
| *H01L 23/535* | (2006.01) |
| *H01L 29/06* | (2006.01) |
| *H01L 29/78* | (2006.01) |
| *H01L 29/49* | (2006.01) |
| *H01L 29/08* | (2006.01) |
| *H01L 29/66* | (2006.01) |

(52) U.S. Cl.
CPC ...... *H01L 29/7816* (2013.01); *H01L 29/7834* (2013.01); *H01L 29/7835* (2013.01); *H01L 29/7836* (2013.01); H01L 29/66795 (2013.01); H01L 29/785 (2013.01)

(56) References Cited

U.S. PATENT DOCUMENTS

| | | |
|---|---|---|
| 8,592,945 B2 | 11/2013 | Chuang |
| 2009/0108375 A1 | 4/2009 | Kiyota |
| 2012/0007179 A1* | 1/2012 | Pang .................. H01L 29/0847 257/344 |
| 2012/0319238 A1 | 12/2012 | Chuang |
| 2014/0141598 A1 | 5/2014 | Ando |
| 2015/0061042 A1 | 3/2015 | Cheng |
| 2015/0115346 A1 | 4/2015 | Hsu |
| 2017/0047403 A1 | 2/2017 | Oda |
| 2017/0084686 A1 | 3/2017 | Wang |

\* cited by examiner

METAL-OXIDE-SEMICONDUCTOR TRANSISTOR AND METHOD OF FORMING GATE LAYOUT

CROSS REFERENCE TO RELATED APPLICATIONS

This is a division of U.S. application Ser. No. 14/952,877, filed on Nov. 25, 2015, which is entirely incorporated herein by reference.

BACKGROUND OF THE INVENTION

1. Field of the Invention

The present invention generally relates to a metal-oxide-semiconductor transistor and a method of forming gate layout, and more particularly, to a method of forming gate layout to reduce gate dishing defect and a related structure of metal-oxide-semiconductor transistor.

2. Description of the Prior Art

With advances in technology, the related industry and technology of semiconductor integrated circuit (IC) has been grown rapidly. High voltage metal-oxide-semiconductor (HV MOS) transistor devices have been broadly utilized in CPU power supply systems, power management systems, AC/DC converters, LCD/plasma TV drivers, automobile electronic components, PC peripheral devices, small DC motor controllers, PC peripheral devices, small DC motor controllers, and other consumer electronic devices due to being capable of enduring the high voltage provided by the electrical power system and having switching characterize together.

In another aspect, as the size of device shrinks continuously, metal gate has gradually replaced the conventional polycrystalline silicon material as being the control electrode configured with high dielectric constant dielectric layer. However, the issues of process integration occur when the metal gates are applied to some specific devices, such as memory devices and high voltage devices.

SUMMARY OF THE INVENTION

It is therefore an objective of the present invention to provide a metal-oxide-semiconductor transistor and a method of forming gate layout, wherein the metal-oxide-semiconductor transistor includes insulating plugs according to the design of the method of forming gate layout of the present invention, so as to prevent the occurrence of gate dishing during the manufacturing process of the metal gate.

An embodiment of the present invention provides a metal-oxide-semiconductor transistor. The metal-oxide-semiconductor transistor includes a substrate, a gate insulating layer, a metal gate, at least one insulating plug and two diffusion regions. The gate insulating layer is disposed on a surface of the substrate. The metal gate is disposed on the gate insulating layer, wherein the metal gate has at least one plug hole therein and is configured to operate under an operation voltage greater than 5 volts (v). The insulating plug is disposed in the plug hole, and the diffusion regions are disposed respectively at two sides of the metal gate in the substrate.

An embodiment of the present invention further provides a metal-oxide-semiconductor transistor. The metal-oxide-semiconductor transistor includes a substrate, a gate insulating layer, a metal gate, at least one insulating plug and two diffusion regions. The gate insulating layer is disposed on a surface of the substrate. The metal gate is disposed on the gate insulating layer, wherein at least one of a length and a width of the metal gate is greater than or equal to approximately 320 nanometers, and the metal gate has at least one plug hole therein. The insulating plug is disposed in the plug hole, and the diffusion regions are disposed respectively at two sides of the metal gate in the substrate.

An embodiment of the present invention even further provides a method of forming a gate layout, and the method includes providing a gate layout design diagram, wherein the gate layout design diagram includes at least one gate pattern. The method further includes disposing at least one insulating plug pattern in the gate pattern for producing a modified gate layout in a case where any one of a length or a width of the gate pattern is greater than a predetermined size, wherein the predetermined size is determined by a process ability limit, and the process ability limit is a smallest gate size that would cause gate dishing when a chemical mechanical polishing (CMP) process is performed to a gate. The method further includes outputting and manufacturing the modified gate layout onto a photomask.

The metal-oxide-semiconductor transistor of the present invention includes the insulating plug(s) disposed in the gate, and therefore the insulating plug(s) may be used as the stop layer during the CMP process to the gate for preventing the occurrence of the gate dishing and further improving the gate structure and the performance of the transistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 10-12 are schematic diagrams illustrating the method of forming the gate layout of the present invention, wherein:

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved.

Figure 1:
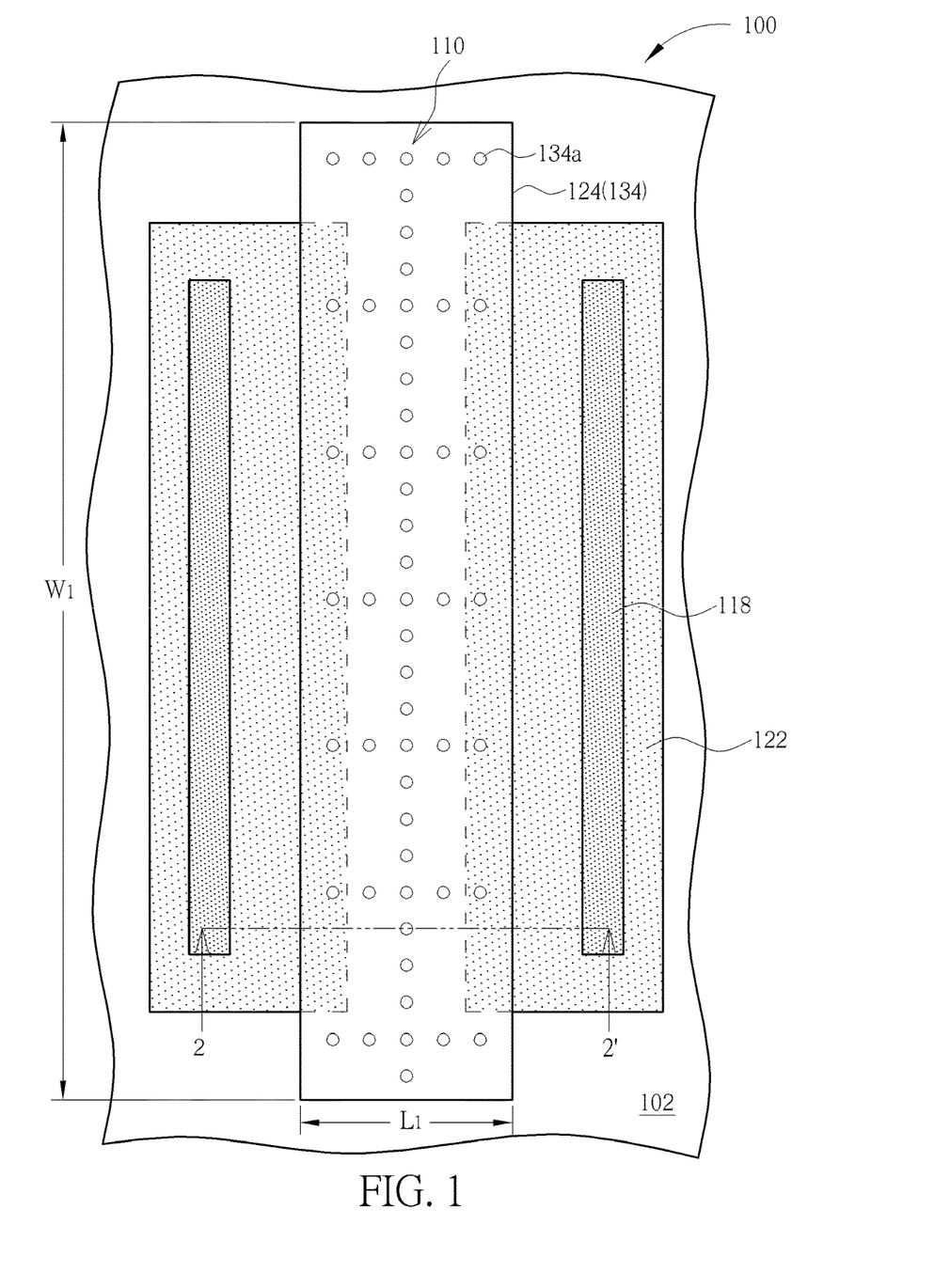
FIG. 1 is a schematic diagram illustrating a top view of a structure of a metal-oxide-semiconductor transistor according to a first embodiment of the present invention.
Figure 2:
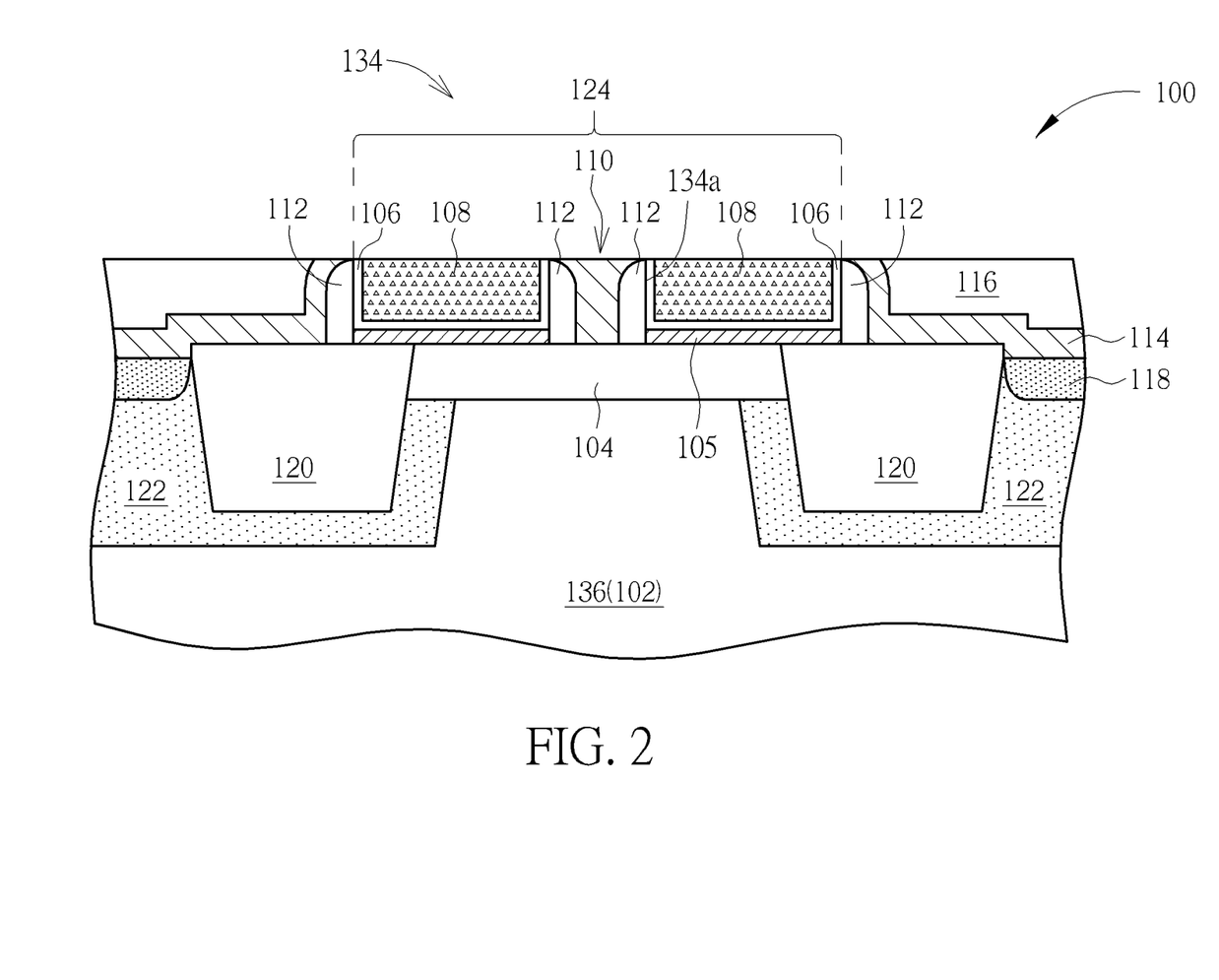
FIG. 2 is a schematic diagram illustrating a partial cross-sectional view of the metal-oxide-semiconductor transistor along a sectional line 2-2' in FIG. 1.

Please refer to FIG. 1 and FIG. 2. FIG. 1 is a schematic diagram illustrating a top view of a structure of a metal-oxide-semiconductor transistor according to a first embodiment of the present invention, and FIG. 2 is a schematic diagram illustrating a partial cross-sectional view of the metal-oxide-semiconductor transistor along a sectional line 2-2' in FIG. 1. As shown in FIG. 1, according to the first embodiment of the present invention, the metal-oxide-semiconductor transistor 100 of the present invention is a high voltage metal-oxide-semiconductor (HV MOS) transistor. For example, an operation voltage of the HV MOS transistor is greater than 5 volts (v), such as several tens of volts, and/or a break down voltage of the HV MOS transistor is greater than 10 volts, such as several tens of volts or even several hundreds of volts. Furthermore, the metal-oxide-semiconductor transistor 100 in this embodiment is a transistor including a metal gate structure 134, i.e. the gate structure is formed with metal, alloy or metallic compound material. The metal-oxide-semiconductor transistor 100 of the present invention includes a substrate 102, a gate insulating layer 104, a gate 124, at least two spacers 112, two diffusion regions 118 and at least one insulating plug 110. To be understood easily, some of the elements of the metal-oxide-semiconductor transistor 100 are omitted, and only a portion of the substrate 102, the gate 124, the drifting regions 122, the diffusion regions 118 serving as a source and a drain respectively, and the insulating plug 110 are illustrated in FIG. 1. Each of devices of the metal-oxide-semiconductor transistor 100 will be detailed as follows. The substrate 102 may be a silicon substrate, a silicon containing substrate (such as SiC), a III-V group substrate (such as GaN), a III-V group-on-silicon substrate (such as GaN-on-silicon), a graphene-on-silicon substrate, a silicon-on-insulator (SOI) substrate, an epitaxial layer containing substrate or other suitable semiconductor substrates for example, but not limited thereto. Shallow trench isolations (STI) 120 may be selectively disposed in the substrate 102 for defining a channel region between the adjacent STIs 120. The gate insulating layer 104 is disposed above the channel region near the surface of the substrate 102. In the HV metal-oxide-semiconductor transistor 100 of this embodiment, the thickness range of the gate insulating layer 104 is from several hundreds of angstroms to less than two thousands of angstroms, and its material may be silicon dioxide, but not limited thereto. The metal-oxide-semiconductor transistor 100 includes the metal gate structure 134, so that the metal-oxide-semiconductor transistor 100 may selectively further include a high dielectric constant (HK) layer 105, wherein the high dielectric constant layer 105 and the gate insulating layer 104 may together provide the gate dielectric function. The metal gate structure 134 includes the gate 124 disposed on the gate insulating layer 104. The gate 124 may include a plurality of layers, such as a metal layer 108 and a work function layer 106 disposed between the metal layer 108 and the gate insulating layer 104. It is noteworthy that the metal gate structure 134 may further include other layers which are not shown in FIG. 2, such as including a plurality of barrier layers, an etching stop layers and an interface tuning layer. Various materials or material combinations may be selected for the work function layer 106 according to different conductivity types of the transistor (such as p-type or n-type). In addition, the spacers 112 of the metal-oxide-semiconductor transistor 100 are at least disposed at two sides of the gate 124, covering the sidewall surfaces of the gate 124. The diffusion regions 118 are disposed respectively at two sides of the gate 124 in the substrate 102, and the diffusion regions 118 of this embodiment are disposed at the sides of the STI 120 opposite to the gate 124 for serving as a source and a drain of the metal-oxide-semiconductor transistor 100 respectively. The metal-oxide-semiconductor transistor 100 may selectively further include one or two doped drifting regions 122 disposed under two sides of the gate 124 in the substrate 102, partially overlapping the gate 124 and surrounding the periphery of the STIs 120 to provide the drift path of electrons. Generally, the diffusion regions 118 and the drifting regions 122 have the same conductivity type. For example, the diffusion regions 118 and the drifting regions 122 of this embodiment are N+ doped regions and N doped regions respectively. It is noteworthy that the gate 124 has a length $L_1$ and a width $W_1$, and at least one of the length $L_1$ or the width $W_1$ of the gate 124 of the present invention is greater than or equal to approximately 320 nanometers. In this embodiment, the length $L_1$ may be 2500 nanometers for example, and the width $W_1$ may be 50000 nanometers for example, but not limited thereto. In addition, the diffusion regions 118, the drifting regions 122 and the STIs 120 are disposed in a P-type well 136 of the substrate 102, i.e. the channel region under the gate insulating layer 104 and the diffusion regions 118 have opposite conductivity types.

In addition, at least one insulating plug 110 is further disposed in the metal gate structure 134, inside at least one plug hole 134a within the gate 124. As shown in FIG. 1, the gate 124 of this embodiment has a plurality of plug holes 134a, the metal gate structure 134 includes a plurality of insulating plugs 110 respectively disposed in one plug hole 134a, and the insulating plugs 110 of this embodiment are arranged in a herringbone pattern in the gate 124. The insulating plugs 110 are formed with insulating material layer(s) filled in the plug holes 134a, such as the material of the spacer 112 covering the surfaces of the plug holes 134a. Moreover, the metal-oxide-semiconductor transistor 100 may selectively include a contact etching stop layer (CESL) 114 and an inter-layer dielectric (ILD) layer 116 disposed on the surface of the substrate 102. The sidewall surface of the gate 124 is covered by the CESL 114, and the CESL 114 of this embodiment further fills the plug holes 134a to form a portion of the insulating plugs 110. In other words, the insulating plugs 110 of the present invention are formed with a portion of the spacer 112 and a portion of the CESL 114. However, in a variant embodiment, the ILD layer 116 may also be formed in the plug holes 134a to form the plug holes 134a when the size of the plug holes 134a is large enough, and therefore the insulating plugs 110 are formed with a portion of the spacer 112, a portion of the CESL 114 and a portion of the ILD layer 116. In addition, the ILD layer 116 is disposed at the periphery of the metal gate structure 134 to insulate the metal gate structure 134 from other electronic devices. Furthermore, the metal-oxide-semiconductor transistor 100 may also selectively include other contact devices (not shown) disposed on the metal gate structure 134 or adjacent to the metal gate structure 134, electrically connected to the gate 124 or the diffusion regions 118. The above mentioned contact devices are preferably disposed away from the insulating plugs 110.

It is noteworthy that the purpose of the design of disposing the insulating plugs 110 in the gate 124 of this embodiment is to prevent the occurrence of gate dishing when performing the gate CMP process to the gate 124. For example, when the maximum value of the process ability limit (also understood as technology layout rule, TLR) of the current CMP process is 2 micrometers which will not lead to dishing, it means the surface dishing will occur as the CMP process is performed to the metal gate 124 under the condition that any one of the length L or the width W of the metal gate 124 is greater than micrometers. Therefore, a distance between any two adjacent insulating plugs 110 is preferably designed to be less than or equal to the process ability limit, 2 micrometers, according to the concept of the present invention. In another aspect, the size of the insulating plugs 110 (i.e. the diameter of the plug hole 134a) may be small since it is designed to avoid fringe voltage caused due to the relatively large size of insulating plugs 110. For example, the size or the diameter of the insulating plugs 110 may be approximately 80 nanometers to 120 nanometers, but not limited thereto.

The method of manufacturing the metal gate structure 134 of this embodiment utilizes the gate-last process and HK-first process. In other words, a high dielectric constant layer and a polysilicon layer are formed on the surface of the substrate 102 first, then a photomask including a gate pattern and plug hole patterns is utilized to perform a photolithography and etching process to pattern the polysilicon layer and the high dielectric constant layer for forming a polysilicon dummy gate and the plug holes 134a simultaneously. However, in a variant embodiment, the gate pattern and the plug hole patterns may be defined by different photolithography process individually. Next, the processes for manufacturing other devices of the transistor are proceeded, such as forming the spacers 112 and the CESL 114 on the sidewall of the dummy gate and in the plug holes 134a, forming the ILD layer 116 and performing a CMP process. Next, the polysilicon dummy gate is removed to form a gate trench, one or more metal materials are deposited to fill the gate trench, and then the one or more metal materials above the ILD layer 154 are removed by performing a CMP process. As a result, as shown in FIG. 2, a top surface of the insulating plug 110, a top surface of the gate 124 and a top surface of the ILD layer 154 of the present invention are substantially coplanar. However, the design of disposing the insulating plugs 110 in the gate of the present invention is not limited to the above mentioned processes, and it may also be applied to the HK-last process for example, and i.e. the high dielectric constant layer is formed after the dummy gate is removed. Besides, the design of disposing the insulating plugs 110 in the gate of the present invention may also be applied to processes for manufacturing a non-planar transistor, such as a dual-gate FinFET or a tri-gate FinFET.

Figure 9:
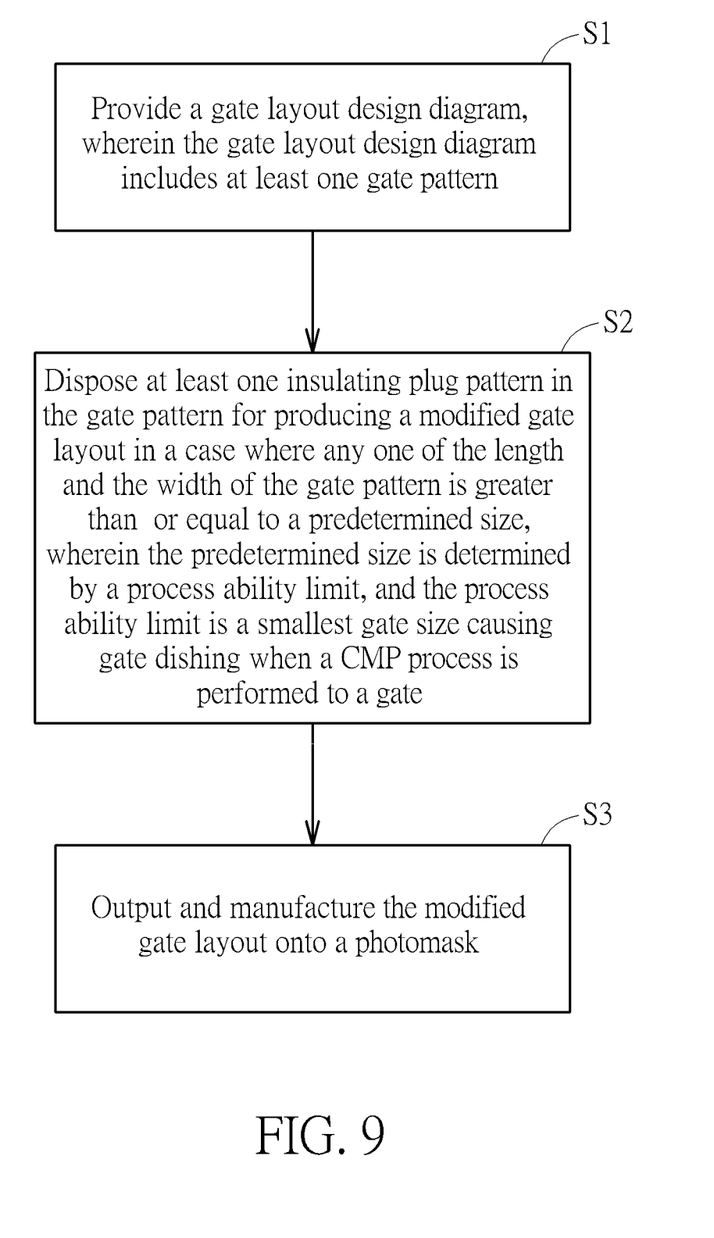
FIG. 9 is a schematic diagram illustrating a process flow of a method of forming a gate layout of the present invention.
Figure 10:
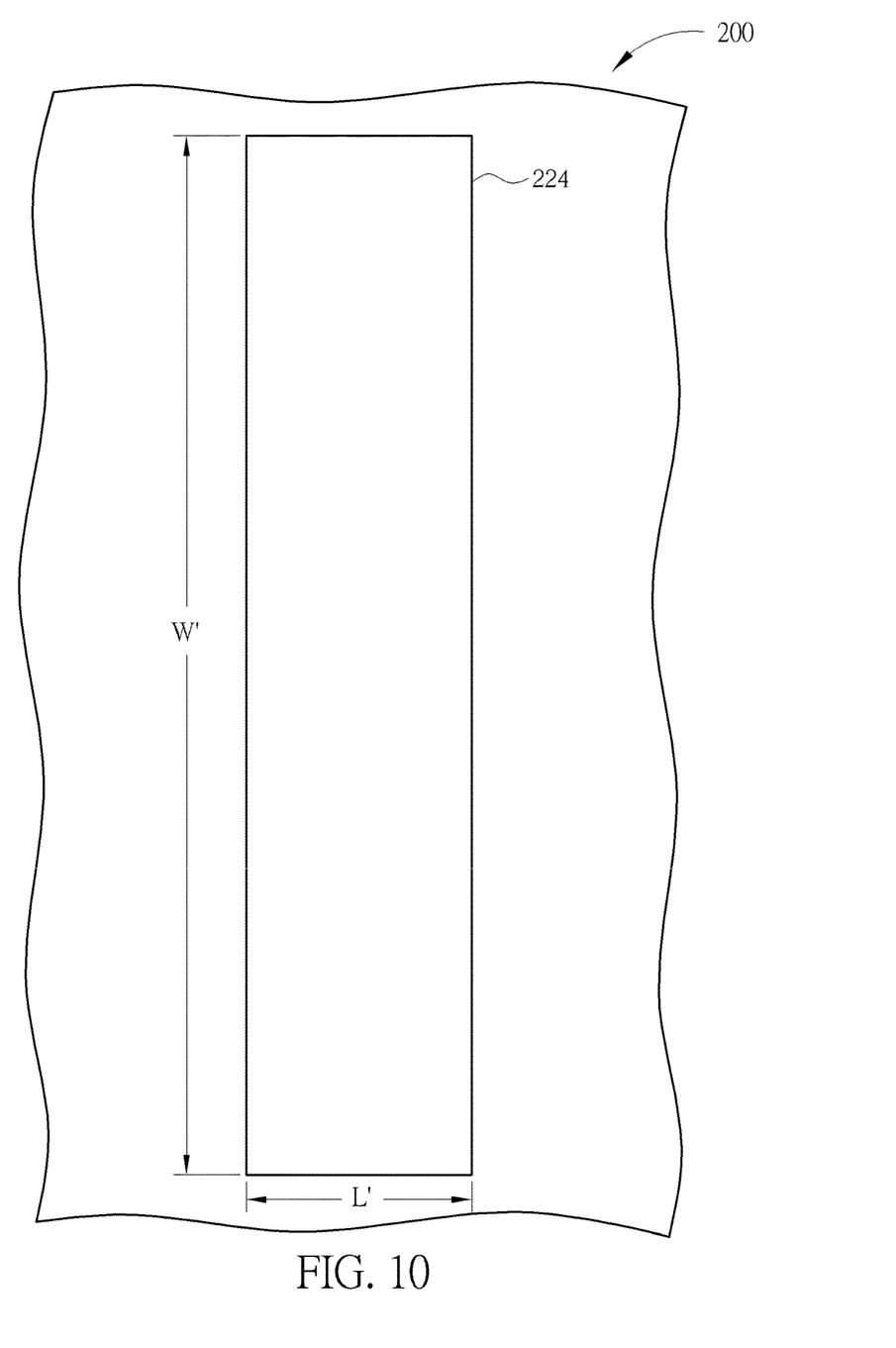
FIG. 10 is a schematic diagram illustrating a gate layout design diagram.
Figure 11:
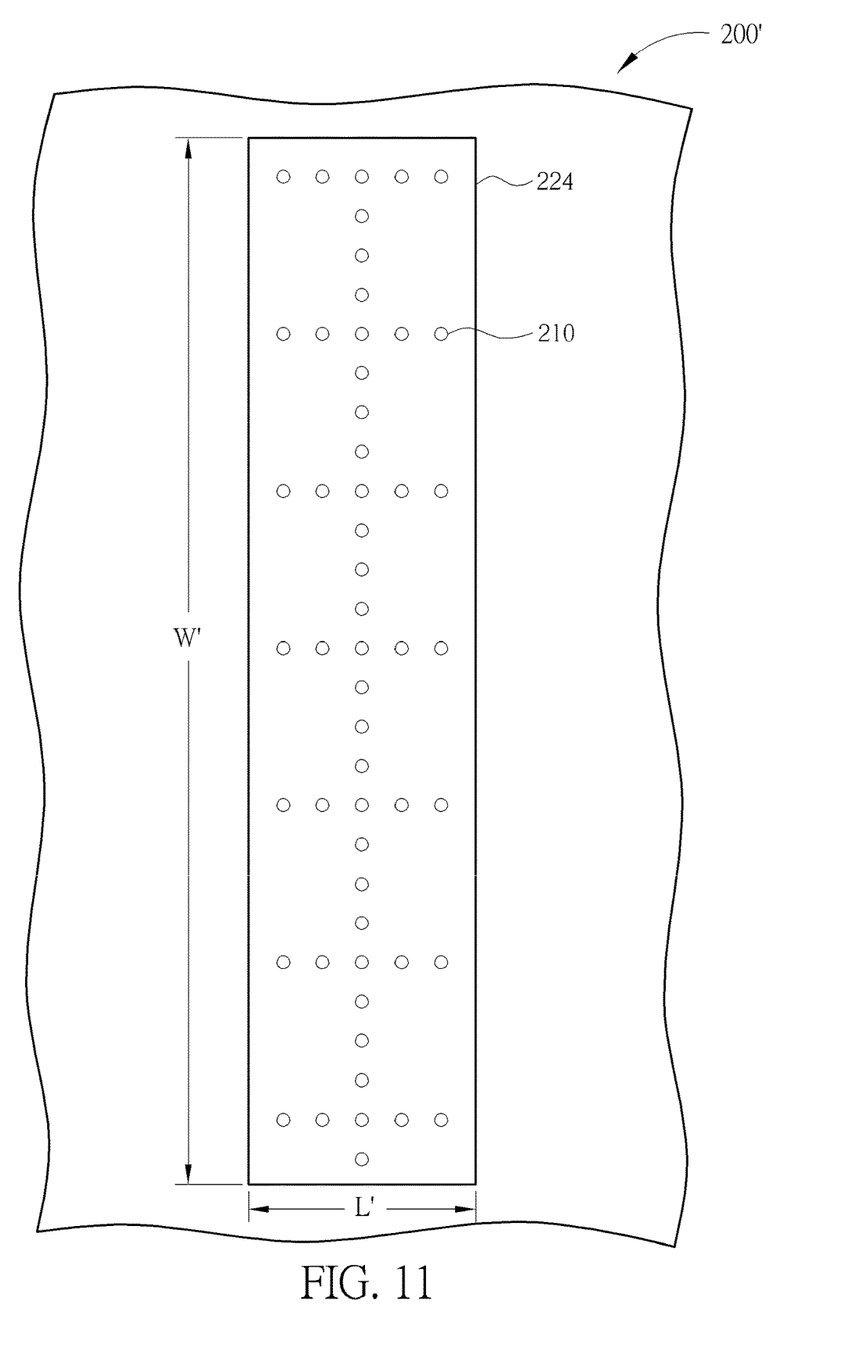
FIG. 11 is a schematic diagram illustrating a modified gate layout.
Figure 12:
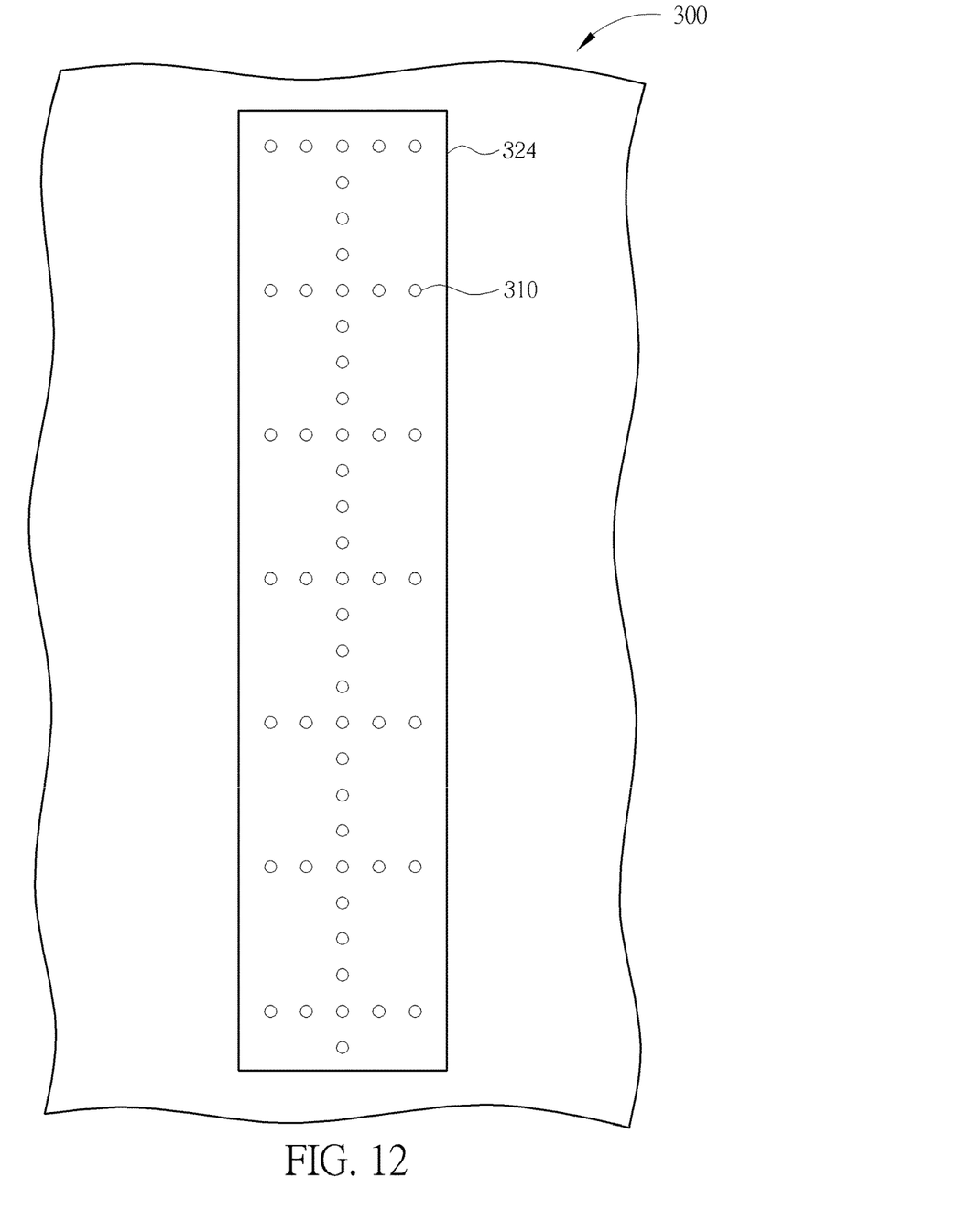
FIG. 12 is a schematic diagram illustrating a photomask including the modified gate layout.

According to the above description, the present invention also provides a method of forming a gate layout. Please refer to FIG. 9 to FIG. 12, wherein FIG. 9 is a schematic diagram illustrating a process flow of the method of forming the gate layout of the present invention, and FIGS. 10-12 are schematic diagrams illustrating the design of the patterns of the gate layout of the present invention. The method of forming the gate layout of the present invention includes the following steps:

Step S1: Provide a gate layout design diagram 200 first, wherein the gate layout design diagram 200 includes at least one gate pattern 224, as shown in FIG. 10.

Step S2: Dispose at least one insulating plug pattern 210 in the gate pattern 224 for producing a modified gate layout 200' in a case where anyone of the length L' and the width W' of the gate pattern 224 is greater than or equal to a predetermined size, wherein the predetermined size is determined by a process ability limit, and the process ability limit is a smallest gate size causing gate dishing when a chemical mechanical polishing (CMP) is performed to the gate, as shown in FIG. 11. The predetermined size of this embodiment is 320 nanometers for example, but not limited thereto. Furthermore, a plurality of insulating plug patterns 210 are disposed in the gate pattern 224 in this embodiment, and a distance between any two adjacent insulating plug patterns 210 is less than or equal to the predetermined size.

Step S3: Output and manufacture the pattern of the modified gate layout 200' onto a photomask 300, as shown in FIG. 12. The photomask 300 includes a gate pattern 324 and insulating plug patterns 310 corresponding to the gate pattern 224 and the insulating plug patterns 210 in the modified gate layout 200' respectively.

Next, the photomask 300 may be applied to a photolithography process for transferring the modified gate layout 200' onto a material layer, such as the aforementioned polysilicon material layer. It is noteworthy that the size of the insulating plug patterns 210 is determined by the size of a minimum exposure limit of the photolithography process while designing the insulating plug patterns 210. Therefore, the size of the insulating plug patterns 210 may be designed to be greater than or equal to a smallest size, wherein a pattern with such smallest size can be formed by the photolithography process while a pattern with a size smaller than such smallest size would not be formed by the photolithography process. However, the insulating plug patterns 210 may also be designed to have a relatively large size according to requirements provided that the size and the density of the insulating plug patterns 210 do not affect the electrical performance of the gate. In addition, according to the aforementioned method of disposing insulating plug(s) 110 of the present invention, the distance between adjacent the insulating plugs 110 and the number of the insulating plugs 110 disposed in the direction of the length $L_1$ do not manifestly affect the electrical characteristics of the metal-oxide-semiconductor transistor 100. For example, the practical operation voltage, saturation current, leakage current and break down voltage of the metal-oxide-semiconductor transistor 100 are not affected or altered manifestly as the number or the density of the insulating plug 110 changes.

The metal-oxide-semiconductor transistor of the present invention is not limited to the aforementioned embodiment. The following description continues to detail other embodiments or variant embodiments. To simplify the description and show the difference between the other embodiments, variant embodiments and the above-mentioned embodiment, identical components in each of the following embodiments are marked with identical symbols, and the identical features will not be redundantly described.

Figure 3:
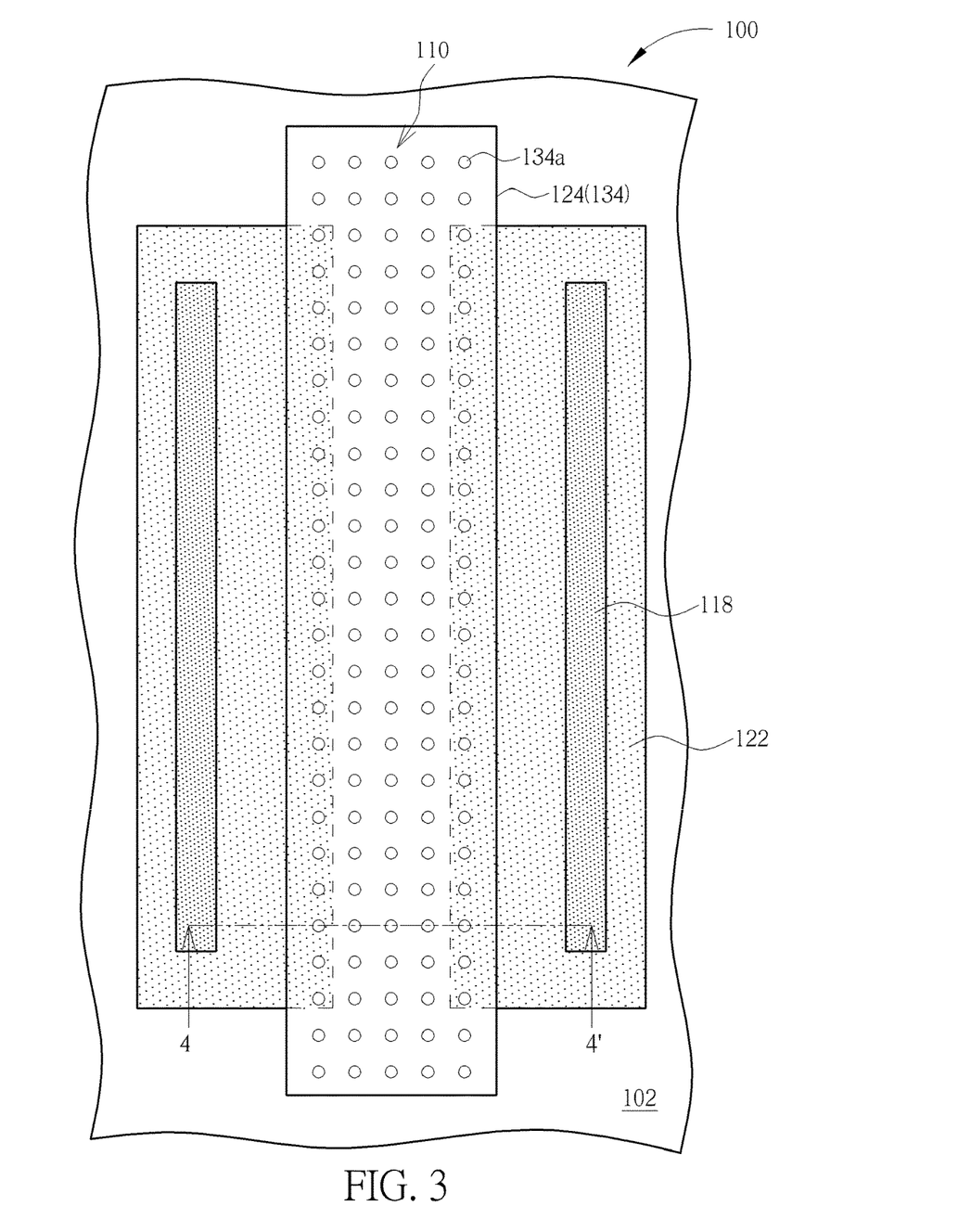
FIG. 3 is a schematic diagram illustrating a top view of a structure of a metal-oxide-semiconductor transistor according to a first variant embodiment of the first embodiment of the present invention.
Figure 4:
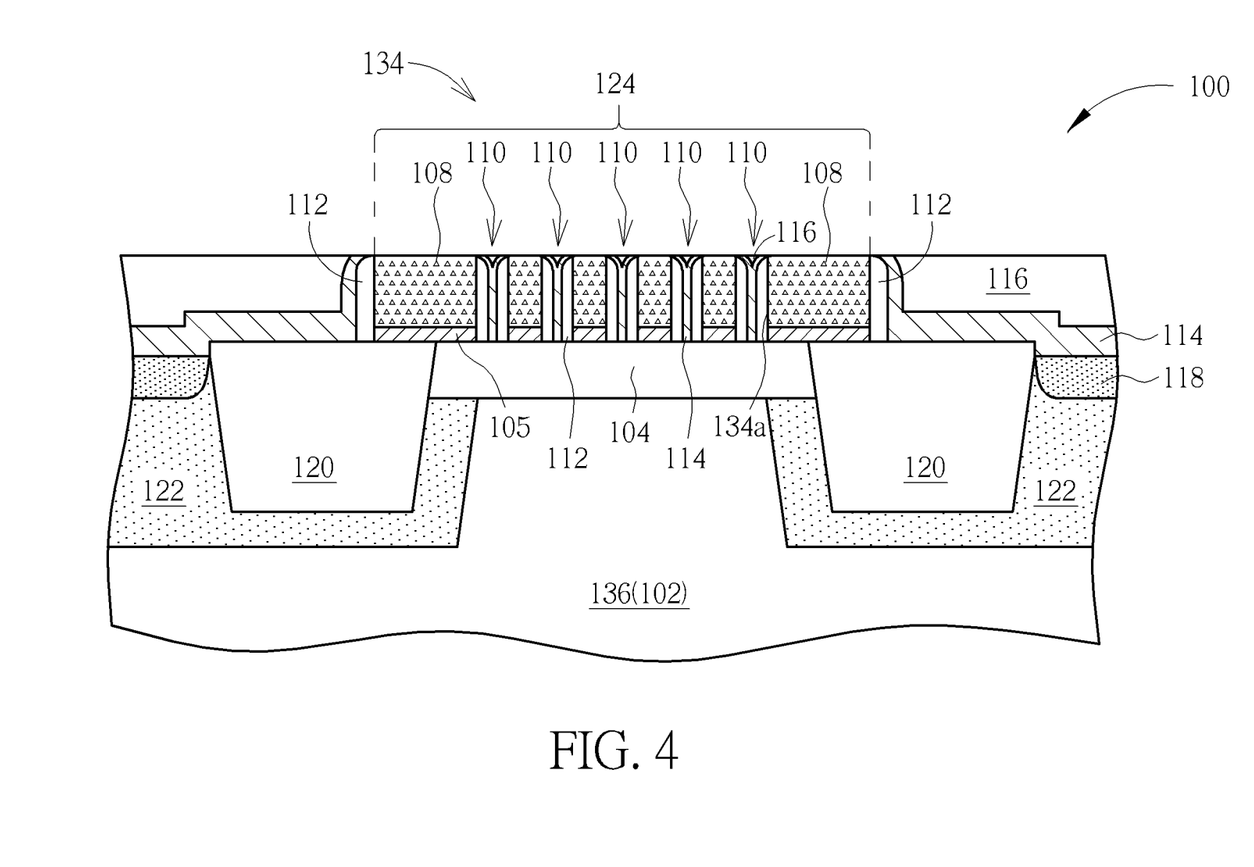
FIG. 4 is a schematic diagram illustrating a partial cross-sectional view of the metal-oxide-semiconductor transistor along a sectional line 4-4' in FIG. 3.

Please refer to FIG. 3 and FIG. 4. FIG. 3 is a schematic diagram illustrating a top view of a structure of a metal-oxide-semiconductor transistor according to a first variant embodiment of the first embodiment of the present invention, and FIG. 4 is a schematic diagram illustrating a partial cross-sectional view of the metal-oxide-semiconductor transistor along a sectional line 4-4' in FIG. 3. A portion of devices shown in the cross-sectional structure are omitted in FIG. 3, such as the spacer, the STI and the CESL layer. The work function layer 106 of the metal gate structure 134 is omitted in the FIG. 4. The above-described simplification representations in figures are also applied to the following embodiments and the variant embodiments, and will not be redundantly described. The difference between this embodiment and the previous embodiment is that the insulating plugs 110 are arranged in a checker pattern in the gate 124. Distances between each insulating plug 110 and other adjoining insulating plugs 110 which are located on the up side, under side, left side and right side thereof are the same, such as 2 micrometers, but not limited thereto. In the cross-sectional structure in FIG. 4, five insulating plugs 110 are sequentially disposed from left to right in the gate 124, and a portion of the spacer 112, a portion of the CESL 114 and a portion of the ILD layer 116 are included in each insulating plug 110.

Figure 5:
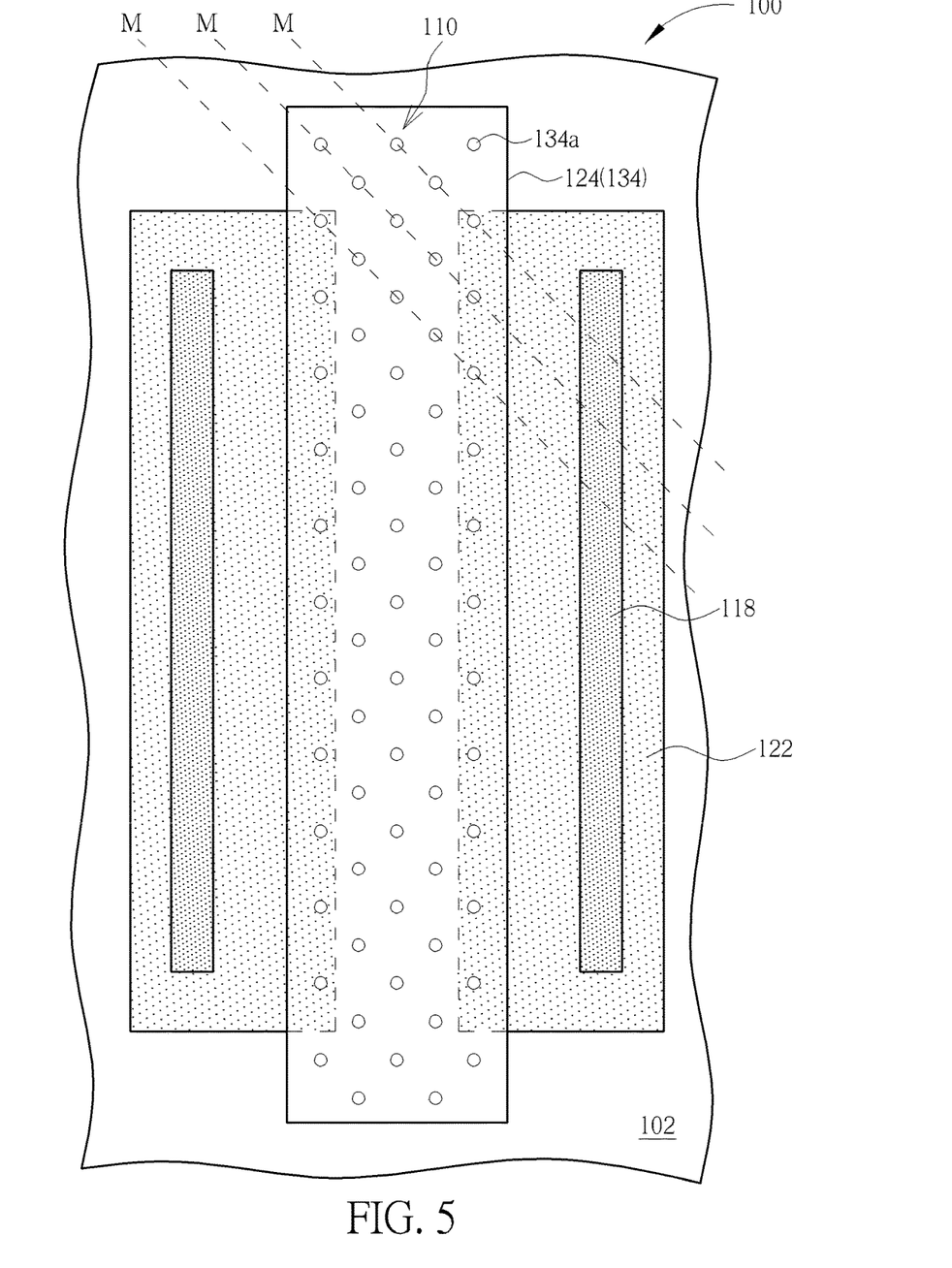
FIG. 5 is a schematic diagram illustrating a top view of a structure of a metal-oxide-semiconductor transistor according to a second variant embodiment of the first embodiment of the present invention.

Please refer to FIG. 5, which is a schematic diagram illustrating a top view of a structure of a metal-oxide-semiconductor transistor according to a second variant embodiment of the first embodiment of the present invention. The main difference between the present embodiment and the first embodiment is related to the arrangement of the insulating plugs 110. The insulating plugs 110 of this embodiment are arranged in multiple rhombuses. In another words, the insulating plugs 110 are arranged in a plurality of straight lines M that are not parallel to the long edge or the short edge of the pattern of the gate 124, wherein the dotted lines in FIG. 5 refer to the straight lines M.

Figure 6:
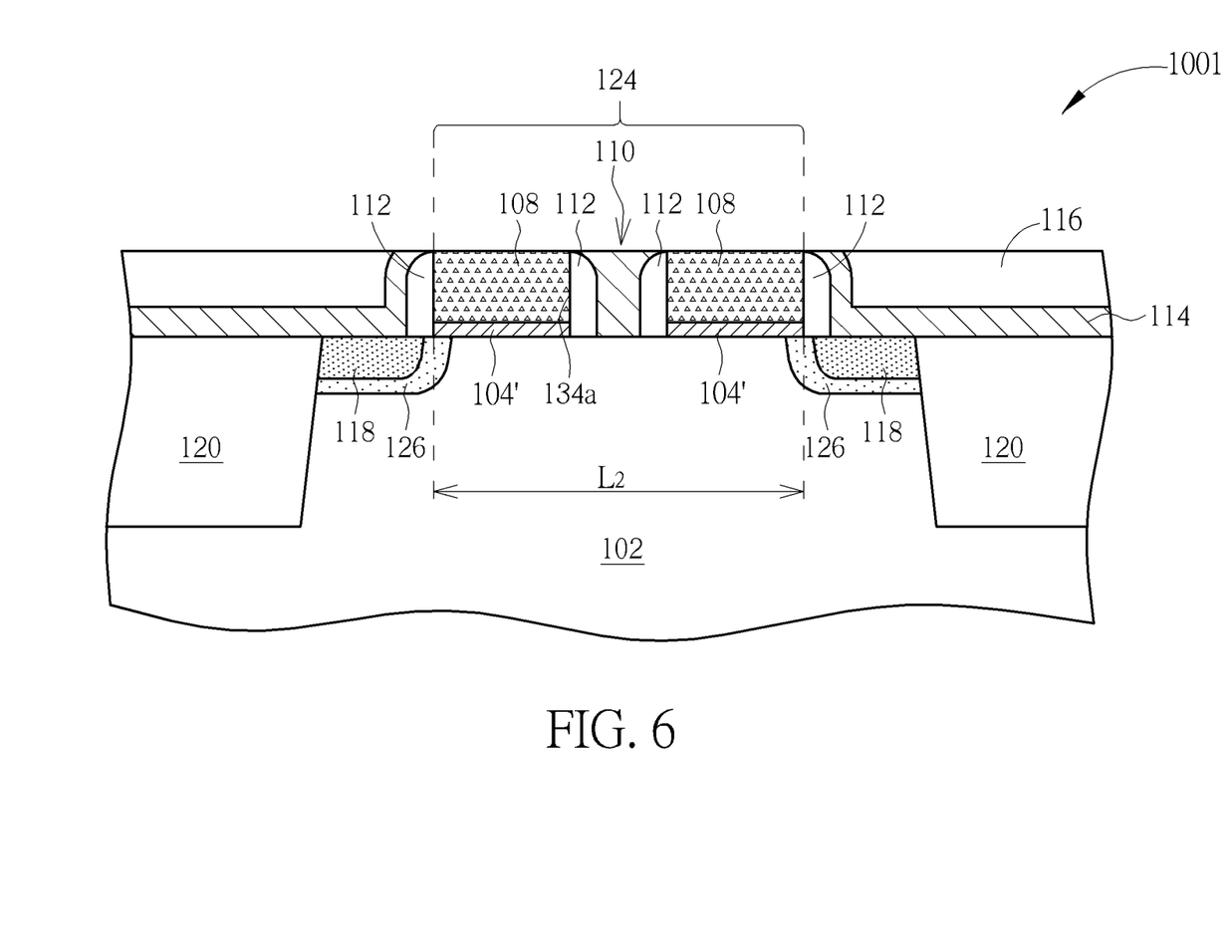
FIG. 6 is a schematic diagram illustrating a partial cross-sectional view of a metal-oxide-semiconductor transistor of a second embodiment of the present invention.

Please refer to FIG. 6, which is a schematic diagram illustrating a partial cross-sectional view of a metal-oxide-semiconductor transistor of a second embodiment of the present invention. The metal-oxide-semiconductor transistor 1001 of this embodiment is a normal voltage metal oxide semiconductor field effect transistor (NV MOSFET), and the length $L_2$ of the metal-oxide-semiconductor transistor 1001 is less than the length $L_1$ of the gate 124 in the first embodiment. However, at least one of the length $L_2$ and the width (not shown in FIG. 6) of the gate 124 of this embodiment is still greater than 320 nanometers, or an operation voltage of the gate 124 is greater than 5 volts. The metal-oxide-semiconductor transistor 1001 includes the gate insulating layer 104' disposed on the surface of the substrate 102, the gate 124 disposed between the STIs 120, the diffusion regions 118 disposed at two sides of the gate 124 near the surface of the substrate 102 for serving as the source and drain, the spacers 112 disposed on the sidewall surfaces of the gate 124 and the sidewall surfaces of the plug holes 134a, and the CESL 114 covering the spacers 112. The metal-oxide-semiconductor transistor 1001 may further include an ILD layer 116 surrounding the gate 124 and two lightly doped regions 126 disposed in the substrate 102 and at two sides of the gate 124, wherein the lightly doped regions 126 surround the diffusion regions 118 in the substrate 102 respectively.

Figure 7:
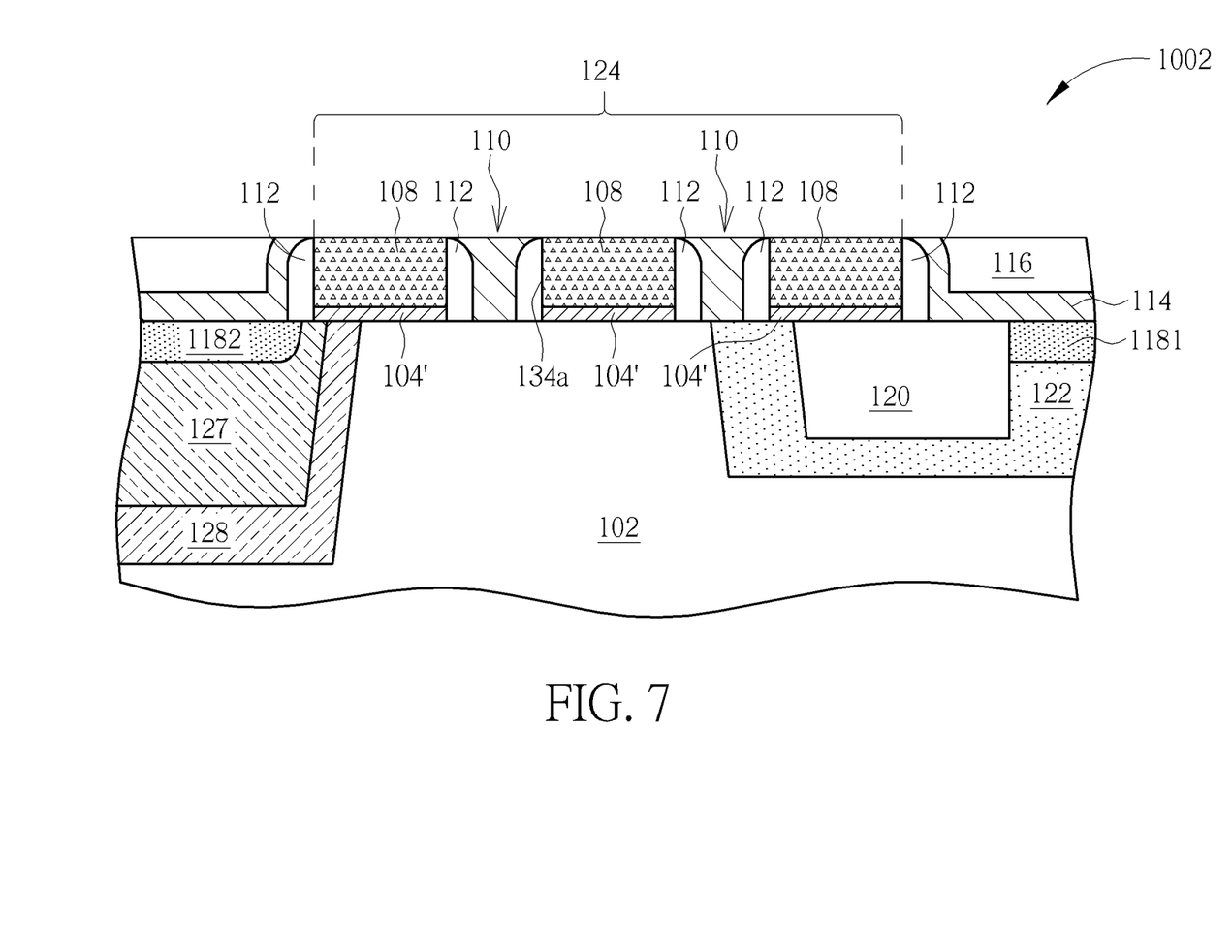
FIG. 7 is a schematic diagram illustrating a partial cross-sectional view of a metal-oxide-semiconductor transistor of a third embodiment of the present invention.

Please refer to FIG. 7, which is a schematic diagram illustrating a partial cross-sectional view of a metal-oxide-semiconductor transistor of a third embodiment of the present invention. The metal-oxide-semiconductor transistor 1002 of this embodiment is a laterally diffused metal oxide semiconductor (LDMOS) transistor, such as an N-type LDMOS transistor. In this embodiment, at least one of the length or the width (not shown in FIG. 7) of the gate 124 of the metal-oxide-semiconductor transistor 1002 is greater than 320 nanometers, or the operation voltage of the gate 124 is greater than 5 volts. A plurality of insulating plugs 110 are disposed in the gate 124, and the insulating plugs 110 are formed with the spacers 112 and the CESL 114, but not limited thereto. In addition, the metal-oxide-semiconductor transistor 1002 may selectively include a STI 120 disposed at one side of the gate 124 in the substrate 102. In FIG. 7, the STI 120 is disposed at the right side of the gate 124 and partially overlaps the gate 124. However, in other variant embodiments, the STI 120 may not overlap the gate 124 or the metal-oxide-semiconductor transistor 1002 may not include the STI 120 being adjacent to the gate 124. The metal-oxide-semiconductor transistor 1002 further includes: two N+ type diffusion regions 1181, 1182 respectively disposed at two sides of the gate 124, wherein the N+ type diffusion region 1181 serving as the source is disposed at the side of the STI 120 opposite to the gate 124; an N-type drifting region 122 surrounding the STI 120 and the N+ type diffusion region 1181; a selective P-type diffusion region 127 disposed in the substrate 102 and surrounding the N+ type diffusion region 1182 serving as the drain; and a p-type well 128 surrounding the P-type diffusion region 127.

Figure 8:
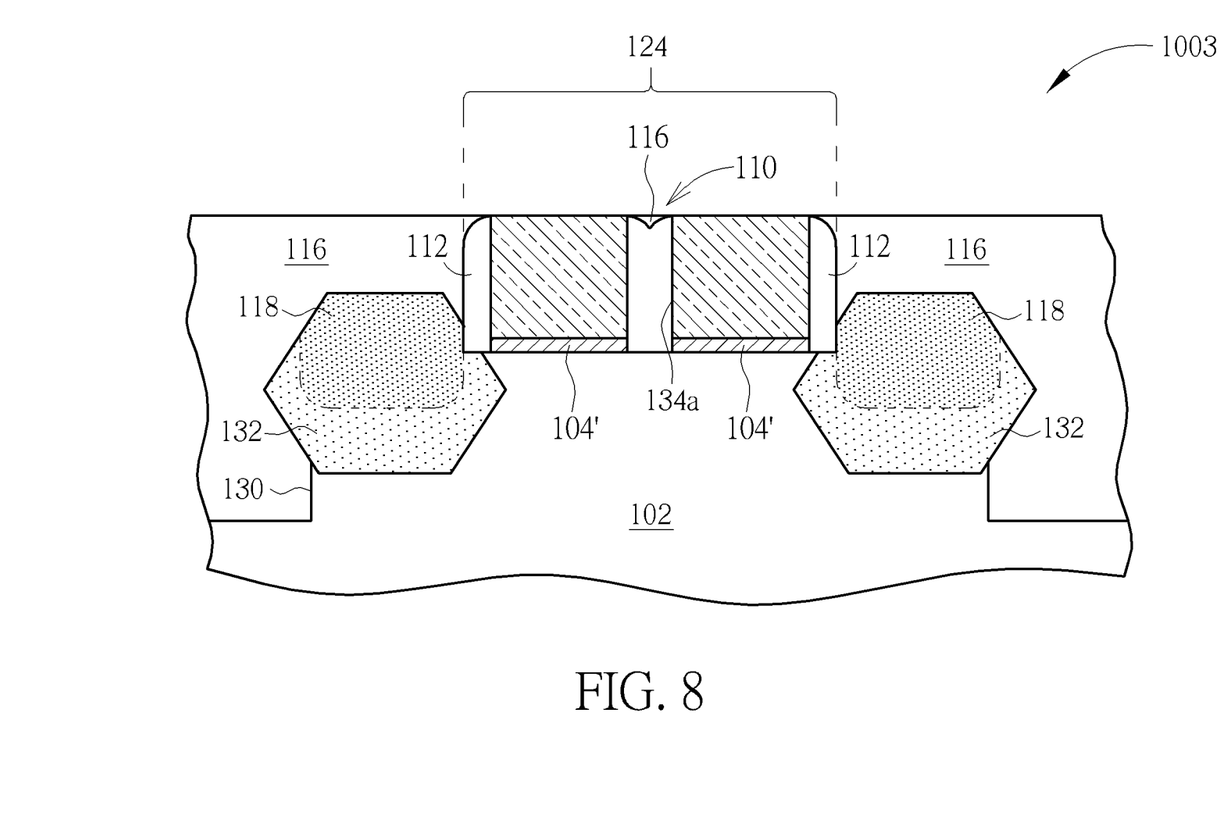
FIG. 8 is a schematic diagram illustrating a partial cross-sectional view of a metal-oxide-semiconductor transistor of a fourth embodiment of the present invention.

Please refer to FIG. 8, which is a schematic diagram illustrating a partial cross-sectional view of a metal-oxide-semiconductor transistor of a fourth embodiment of the present invention. The metal-oxide-semiconductor transistor 1003 of this embodiment is a fin field effect transistor (finFET). The substrate 102 includes a fin structure 130, the gate 124 is disposed on the fin structure 130, and the fin structure 130 may selectively include an epitaxial layer 132. The diffusion regions 118 serving as the source and drain are respectively disposed at two sides of the gate 124 on the surface of the epitaxial layer 132. At least one of the length or the width (not shown in FIG. 8) of the gate 124 of the metal-oxide-semiconductor transistor 1003 of this embodiment is greater than 320 nanometers, or the operation voltage of the gate 124 is greater than 5 volts. The gate 124 still includes a plurality of insulating plugs 110 disposed therein. However, only one insulating plug 110 is shown in FIG. 8 for illustration.

In the conventional method of manufacturing the metal gate, the polysilicon dummy gate is formed first, and the dummy gate is removed to form the gate trench after other devices of the transistor are manufactured. Then, the metal material is deposited and filled in the gate trench, and the CMP process is performed to remove the excessive metal material to finish the manufacturing of the metal gate. However, the channel length of the gate structure of the HV MOS transistor is relatively long to provide a high operation voltage, i.e. the size of the gate structure is relatively large. Under the above circumstances, the gate surface dishing will occur during the CMP process, and the electrical performance of the transistor will also be affected. In contrast, the main concept of the present invention, from the aforementioned embodiments, is to dispose one or pluralities of insulating plug(s) in the gate of the transistor whose size is large or having a high operation voltage. For example, when the size of the gate is greater than the process ability limit, the insulating plug can be disposed in the gate to serve as the stop layer in the following CMP process, which can prevent the gate from dishing due to the over-polishing. The number, size, density and arrangement of the insulating plugs in the gate of the present invention are not limited provided that the electrical performance of the transistor is not affected. In addition, the metal-oxide-semiconductor transistor of the present invention may be metal-oxide-semiconductor transistors having various types of structures, such as HVMOS transistor, LDMOS transistor, NVMOS transistor or finFET, but not limited thereto. According to the present invention, the disposing of the insulating plug truly improves the issue of gate surface dishing in the prior art, and further improves the yield in manufacturing the transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal-oxide semiconductor transistor, comprising:
   a substrate;
   a gate insulating layer disposed on a surface of the substrate;
   a metal gate disposed on the gate insulating layer, wherein at least one of a length and a width of the metal gate is greater than or equal to approximately 320 nanometers, and the metal gate has at least one plug hole;
   at least one insulating plug disposed in the plug hole;
   two diffusion regions disposed respectively at two sides of the metal gate in the substrate; and
   at least one shallow trench isolation disposed between the metal gate and the substrate, wherein a portion of the metal gate is disposed on the shallow trench isolation, and a portion of the gate insulating layer is disposed below a top surface of the shallow trench isolation.

2. The metal-oxide semiconductor transistor according to claim 1, further comprising at least one spacer covering sidewall surface of the metal gate, the insulating plug comprising a portion of the spacer and/or a portion of an inter-layer dielectric (ILD) layer.

3. The metal-oxide semiconductor transistor according to claim 1, wherein a size of the insulating plug is approximately 80 nanometers to approximately 120 nanometers.

4. The metal-oxide semiconductor transistor according to claim 1, wherein the metal gate comprises a plurality of plug holes, and the metal-oxide semiconductor transistor comprises a plurality of insulating plugs respectively disposed in the plug holes.

5. The metal-oxide semiconductor transistor according to claim 4, wherein the insulating plugs are arranged in a herringbone pattern or a checker pattern in the metal gate.

6. The metal-oxide semiconductor transistor according to claim 1, wherein the metal gate comprises at least one work function material.

* * * * *